United States Patent
Yeh et al.

(10) Patent No.: US 9,705,033 B2
(45) Date of Patent: Jul. 11, 2017

(54) LED WITH CURRENT SPREADING LAYER AND FABRICATION METHOD

(71) Applicant: XIAMEN SANAN OPTOELECTRONICS TECHNOLOGY CO., LTD., Xiamen (CN)

(72) Inventors: Meng-Hsin Yeh, Xiamen (CN); Jyh-Chiarng Wu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/531,973

(22) Filed: Nov. 3, 2014

(65) Prior Publication Data

US 2015/0053920 A1    Feb. 26, 2015

Related U.S. Application Data

(63) Continuation of application No. PCT/CN2013/077409, filed on Jun. 18, 2013.

(30) Foreign Application Priority Data

Jun. 19, 2012    (CN) .......................... 2012 1 0202007

(51) Int. Cl.
*H01L 33/00* (2010.01)
*H01L 33/14* (2010.01)
(Continued)

(52) U.S. Cl.
CPC .......... *H01L 33/14* (2013.01); *H01L 33/0025* (2013.01); *H01L 33/0075* (2013.01);
(Continued)

(58) Field of Classification Search
CPC ....... H01L 33/14; H01L 33/145; H01L 33/32; H01L 33/007; G02F 1/13627
(Continued)

(56) References Cited

U.S. PATENT DOCUMENTS 7,193,246 B1 * 3/2007 Tanizawa et al. .............. 257/94
8,294,178 B2 * 10/2012 Koo .................. H01L 33/14
257/101

(Continued)

FOREIGN PATENT DOCUMENTS

CN    102097560 A  *  6/2011

OTHER PUBLICATIONS

Liu et al, "Efficiency Enhancement of InGaN LEDs With an n-type AlGaN/GaN/InGaN Current Spreading Layer", IEEE Electron Device Letters, vol. 32, No. 10, Oct. 2011, p. 1409-1411.*

*Primary Examiner* — Jarrett Stark
*Assistant Examiner* — Charles N Ausar-El
(74) *Attorney, Agent, or Firm* — Syncoda LLC; Feng Ma; Junjie Feng

(57) ABSTRACT

A lighting emitting diode including: an n side layer and a p side layer formed by nitride semiconductors respectively; an active layer comprising a nitride semiconductor is between the n side layer and the p side layer; wherein, the n-side layer is successively laminated by an extrinsically-doped buffer layer and a compound multi-current spreading layer; the compound multi-current spreading layer is successively-laminated by a first current spreading layer, a second current spreading layer and a third current spreading layer; the first current spreading layer and the third current spreading layer are alternatively-laminated layers comprising a u-type nitride semiconductor layer and an n-type nitride semiconductor layer; the second current spreading layer is a distributed insulation layer formed on the n-type nitride semiconductor layer; and the first current spreading layer is adjacent to the extrinsically-doped buffer layer; and the third current spreading layer is adjacent to the active layer.

20 Claims, 9 Drawing Sheets

(51) Int. Cl.
   *H01L 33/32*   (2010.01)
   *H01L 33/06*   (2010.01)

(52) U.S. Cl.
   CPC ........ *H01L 33/0079* (2013.01); *H01L 33/325* (2013.01); *H01L 33/007* (2013.01); *H01L 33/06* (2013.01); *H01L 33/145* (2013.01)

(58) Field of Classification Search
   USPC .......................................................... 257/13
   See application file for complete search history.

(56) References Cited

U.S. PATENT DOCUMENTS

| | | | |
|---|---|---|---|
| 8,704,207 B2* | 4/2014 | Yanagihara et al. ............ | 257/12 |
| 8,860,044 B2* | 10/2014 | Yeh et al. ........................ | 257/88 |
| 2007/0045655 A1* | 3/2007 | Song ....................... | H01L 33/04 |
| | | | 257/104 |
| 2008/0135867 A1* | 6/2008 | Feng ........................ | H01L 33/42 |
| | | | 257/99 |
| 2010/0207100 A1* | 8/2010 | Strassburg ............. | B82Y 20/00 |
| | | | 257/15 |
| 2010/0252859 A1* | 10/2010 | Son ......................... | H01L 33/02 |
| | | | 257/103 |
| 2011/0006320 A1* | 1/2011 | Koo ........................ | H01L 33/14 |
| | | | 257/94 |
| 2011/0198610 A1* | 8/2011 | Fujikura ......................... | 257/76 |
| 2012/0097918 A1* | 4/2012 | Yu et al. ......................... | 257/13 |
| 2013/0001508 A1* | 1/2013 | Lin et al. ........................ | 257/13 |
| 2013/0001510 A1* | 1/2013 | Chu et al. ....................... | 257/13 |
| 2013/0126825 A1* | 5/2013 | Walter ............................ | 257/13 |
| 2014/0042485 A1* | 2/2014 | Pan ........................ | H01L 33/145 |
| | | | 257/99 |
| 2015/0270439 A1* | 9/2015 | Lin ......................... | H01L 33/14 |
| | | | 257/13 |

* cited by examiner

LED WITH CURRENT SPREADING LAYER AND FABRICATION METHOD

CROSS-REFERENCE TO RELATED APPLICATIONS

The present application is a continuation of, and claims priority to, PCT/CN2013/077409, filed Jun. 18, 2013, which claims priorities to Chinese Patent Application No. CN 201210202007.2, filed Jun. 19, 2012. The disclosures of the above applications are hereby incorporated by reference in their entirety.

BACKGROUND

To improve light-emitting efficiency of the GaN-based chip, the substrate transfer technology has been developed in recent years. The transfer processes may include: depositing a GaN-based thin film over the sapphire substrate via MOCVD, bonding the GaN-based thin film to the semiconductor or metal base using wafer bonding technology or electroplating technique, and removing the sapphire substrate using laser lift-off method; or depositing a GaN-based thin film over the SiC or Si substrate, bonding the GaN-based thin film to the semiconductor or metal base using wafer bonding technology or electroplating technique, and removing the SiC or Si substrate using chemical etching method. In this way, the thin-film GaN chip can achieve a higher light-emitting efficiency by adding a reflecting layer between the epitaxial thin film and the base and obtaining a rough light-emitting surface using photochemical etching method over the N-polar surface GaN easily. At the same time, the GaN-based thin-film chip transferred to the heat dissipation base has relatively large advantages in large-current applications due to good thermal conductivity of the transferred base. Further improvements on existing luminous efficiency level are needed for popularizing semiconductor lighting in a true sense.

SUMMARY

According to a first aspect of the present disclosure, an LED with current spreading layer is provided, comprising an n side layer and a p side layer formed by nitride semiconductors respectively; an active layer comprising a nitride semiconductor between the n-side layer and the p-side layer; wherein, the n-side layer is successively laminated by an extrinsically-doped buffer layer and a compound multi-current spreading layer; the compound multi-current spreading layer is successively-laminated by a first current spreading layer, a second current spreading layer and a third current spreading layer; the first current spreading layer and the third current spreading layer are alternatively-laminated layers comprises a u-type nitride semiconductor layer and a n-type nitride semiconductor layer; the second current spreading layer is a distributed insulation layer formed on the n-type nitride semiconductor layer; and the first current spreading layer is adjacent to the extrinsically-doped buffer layer; and the third current spreading layer is adjacent to the active layer.

According to a second aspect of the present disclosure, a fabrication method for the LED with current spreading layer is provided, which includes the following steps: providing a growth substrate and forming an n side layer on the substrate; forming an active layer on the n side layer; forming a p side layer on the active layer to form an epitaxial structure; wherein, the n side layer is successively laminated by an extrinsically-doped buffer layer and a compound multi-current spreading layer; the compound multi-current spreading layer is successively-laminated by a first current spreading layer, a second current spreading layer and a third current spreading layer; the first current spreading layer and the third current spreading layer are alternatively-laminated layers comprises a u-type nitride semiconductor layer and an n-type nitride semiconductor layer; the second current spreading layer is a distributed insulation layer formed on the n-type nitride semiconductor layer; and the first current spreading layer is adjacent to the extrinsically-doped buffer layer; and the third current spreading layer is adjacent to the active layer.

The LED disclosed has good N-type current spreading function. The compound multi-current spreading layer can uniformly spread the current over the whole light emitting area so as to effectively improve the light emitting efficiency of the nitride LED component and the static breakdown voltage.

The other features and advantages of this present disclosure will be described in detail in the following specification, and it is believed that such features and advantages will become more obvious in the specification or through implementations of this invention. The purposes and other advantages of the present disclosure can be realized and obtained in the structures specifically described in the specifications, claims and drawings.

DETAILED DESCRIPTION

The embodiments of the present disclosure will be described in detail with reference to the accompanying figures and preferred embodiments. In specific device design and manufacture, the LED structures according to the present disclosure will be adjusted and changed to some extent in terms of structure and dimension and material selection based on specific application fields and process applications.

Figure 1:
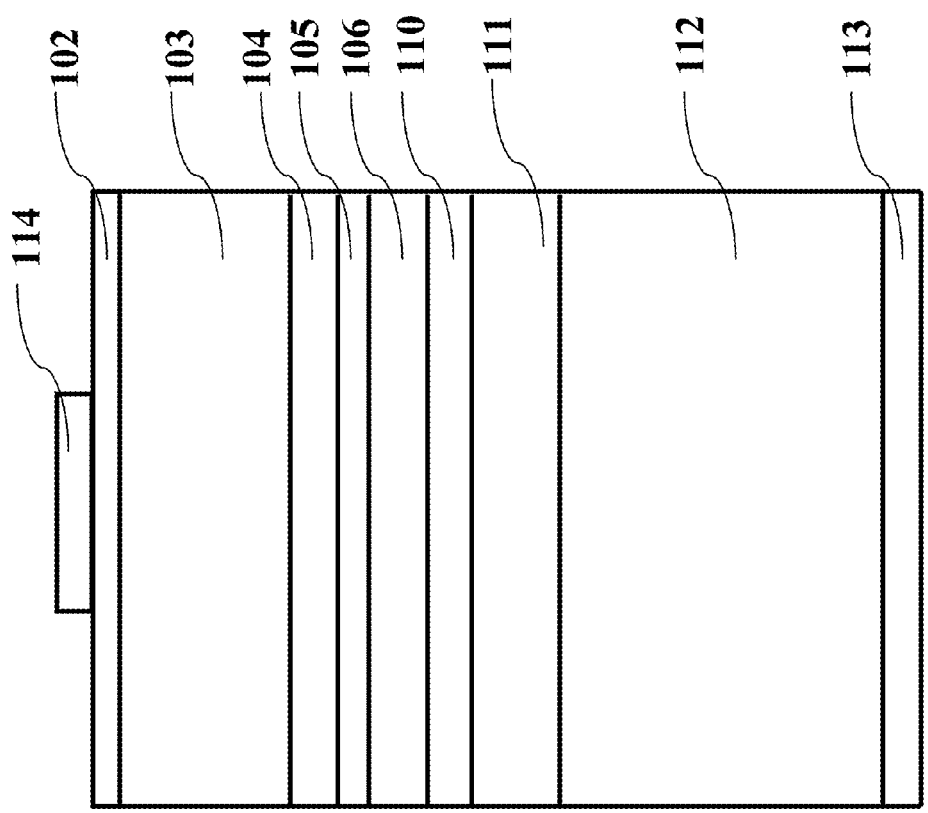
FIG. 1 is a structural diagram of the common GaN-based vertical LED component.
Figure 2:
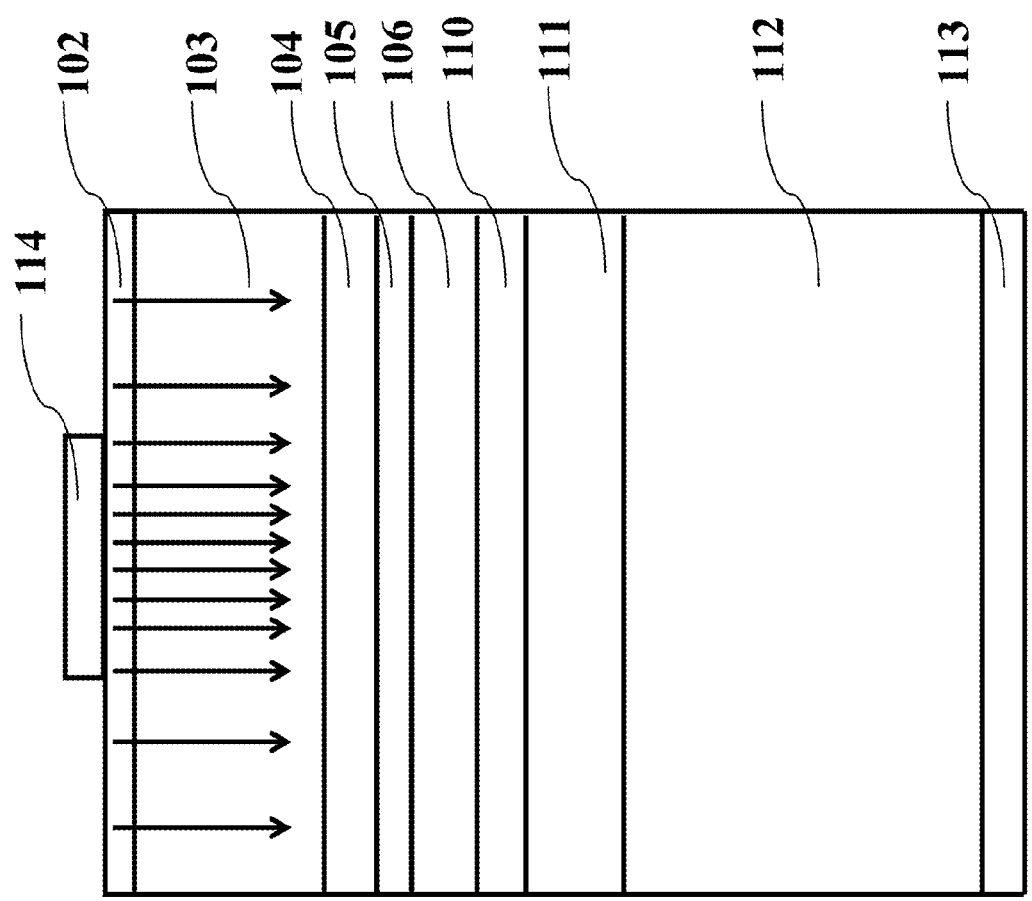
FIG. 2 is a schematic diagram for the current path of the LED component according to FIG. 1.

As shown in FIG. 1, a common GaN-based vertical LED component, comprising from top down an N-surface electrode metal layer 114, an extrinsically-doped buffer layer 102, an N-type GaN layer 103, an active layer 104, an electron blocking layer 105, a P-type GaN layer 106, a P-surface reflector and ohmic electrode layer 110, a P-surface metal diffusion blocking layer and bonding layer 111, a conductive substrate 112 and a bottom electrode metal layer 113. FIG. 2 is a schematic diagram for the current path of the LED component. The deviation of current flew from the N-surface electrode metal layer 114 to the bottom electrode metal layer 113 to the closer path leads to over current density in some areas, thus causing current crowding and limiting the effective improvement of luminous efficiency level.

To solve the problems of the GaN-based vertical LED and to effectively improve the luminous efficiency level, an LED with good N-type current spreading and fabrication method is disclosed.

According to some embodiments, the epitaxial structure of LED with good N-type current spreading comprises an n side layer, an active layer and a p side layer, wherein, the n side layer is successively laminated by an extrinsically-doped buffer layer and a compound multi-current spreading layer. Further, the compound multi-current spreading layer is successively-laminated by a first current spreading layer, a second current spreading layer and a third current spreading layer. The first current spreading layer and the third current spreading layer are alternatively-laminated layers comprising a u-type nitride semiconductor layer and an n-type nitride semiconductor layer; the second current spreading layer is a distributed insulation layer formed on the n-type nitride semiconductor layer. The first current spreading layer is adjacent to the extrinsically-doped buffer layer; and the third current spreading layer is adjacent to the active layer of the LED.

According to some embodiments, the LED with good N-type current spreading also comprises a conductive substrate. The epitaxial structure is on the conductive substrate, wherein, the n-side layer away from the conductive substrate and the p-side layer close to the conductive substrate form a vertical light emitting structure. In general, on the top of the n-side layer has an electrode metal layer. Since the buffer layer is extrinsically-doped, the electrode metal layer can be directly formed on the buffer layer. The first current spreading layer in the compound multi-current spreading layer is designed as an alternatively-laminated layer comprising a u-type nitride semiconductor layer and a n-type nitride semiconductor layer to force a two-dimensional horizontal spreading of different current sources imported from the N-surface electrode metal layer through the alternative layering of the u-type layer and the n-type layer; the second current spreading layer is designed as a distributed insulation layer formed on the n-type nitride semiconductor layer forcing current uniform distribution, so as to form a uniformly distributed point current source (refer to FIG. 3 or FIG. 5); the third current spreading layer is designed as an alternatively-laminated layer comprising a u-type nitride semiconductor layer and an n-type nitride semiconductor layer to force a two-dimensional horizontal spreading of the uniformly-distributed point current source formed by the second current spreading layer through the alternatively-laminated layer of the u-type layer and n-type layer, so as to uniformly spread current over the whole light emitting area, thus outperforming traditional non-current spreading layer and single current spreading designs in terms of achieving current spreading while avoiding current crowding.

The film thickness of the compound multi-current spreading layer in the n-side layer can be 1000 Å-100000 Å. The film thickness of the first current spreading layer and the third current spreading layer can be 350 Å-45000 Å respectively, wherein, the film thickness ratio between the u-type nitride semiconductor layer and the n-type nitride semiconductor layer is more than 0.8 and the number of laminated cycles is 1-100; the film thickness of the second current spreading layer can be 100 Å-5000 Å, wherein, the distributed insulation layer can be comprising insulation parts isolated at preset interval and the process can be formed by ion implantation. According to some preferred embodiments, the film thickness of the first current spreading layer can be 10000 Å-40000 Å; the film thickness ratio between the u-type nitride semiconductor layer and the n-type nitride semiconductor layer is more than 1.5:1 and the number of laminated cycles is 40. The film thickness of the third current spreading layer is 4000 Å-18000 Å; the film thickness ratio between the u-type nitride semiconductor layer and the n-type nitride semiconductor layer is 1:1 and the number of laminated cycles is 18.

According to some preferred embodiments, in the first current spreading layer and the third current spreading layer, the Si-doping concentration in the u-type nitride semiconductor layer is lower than $5 \times 10^{17}$ cm$^{-3}$ and the Si-doping concentration in the n-type nitride semiconductor layer is higher than $1 \times 10^{18}$ cm$^{-3}$.

According to some preferred embodiments, a Si-doped n-type nitride gradient semiconductor layer can be formed between the second current spreading layer and the third current spreading layer. More specifically, the film thickness of the Si-doped n-type nitride gradient semiconductor layer formed through second growth epitaxy can be 200 Å-5000 Å, wherein, the Si-doping concentration gradually changes from $1 \times 10^{17}$ cm$^{-3}$ to $5 \times 10^{19}$ cm$^{-3}$. Preferably, the Si-doping concentration gradually changes from $5 \times 10^{17}$ cm$^{-3}$ to $1 \times 10^{19}$ cm$^{-3}$.

The Si-doped n-type nitride gradient layer between the second current spreading layer and the third current spreading layer is to repair and improve the surface defect due to formation of distributed insulation layer on the second current spreading layer through the Si-doped n-type nitride gradient semiconductor layer so as to maintain the lattice quality of the nitride semiconductor layer after second epitaxy and to serve as the current steering layer of the third current spreading layer Detailed descriptions will be given below in combination with Embodiments 1-2 with reference to FIGS. 3-9.

Embodiment 1

Figure 3:
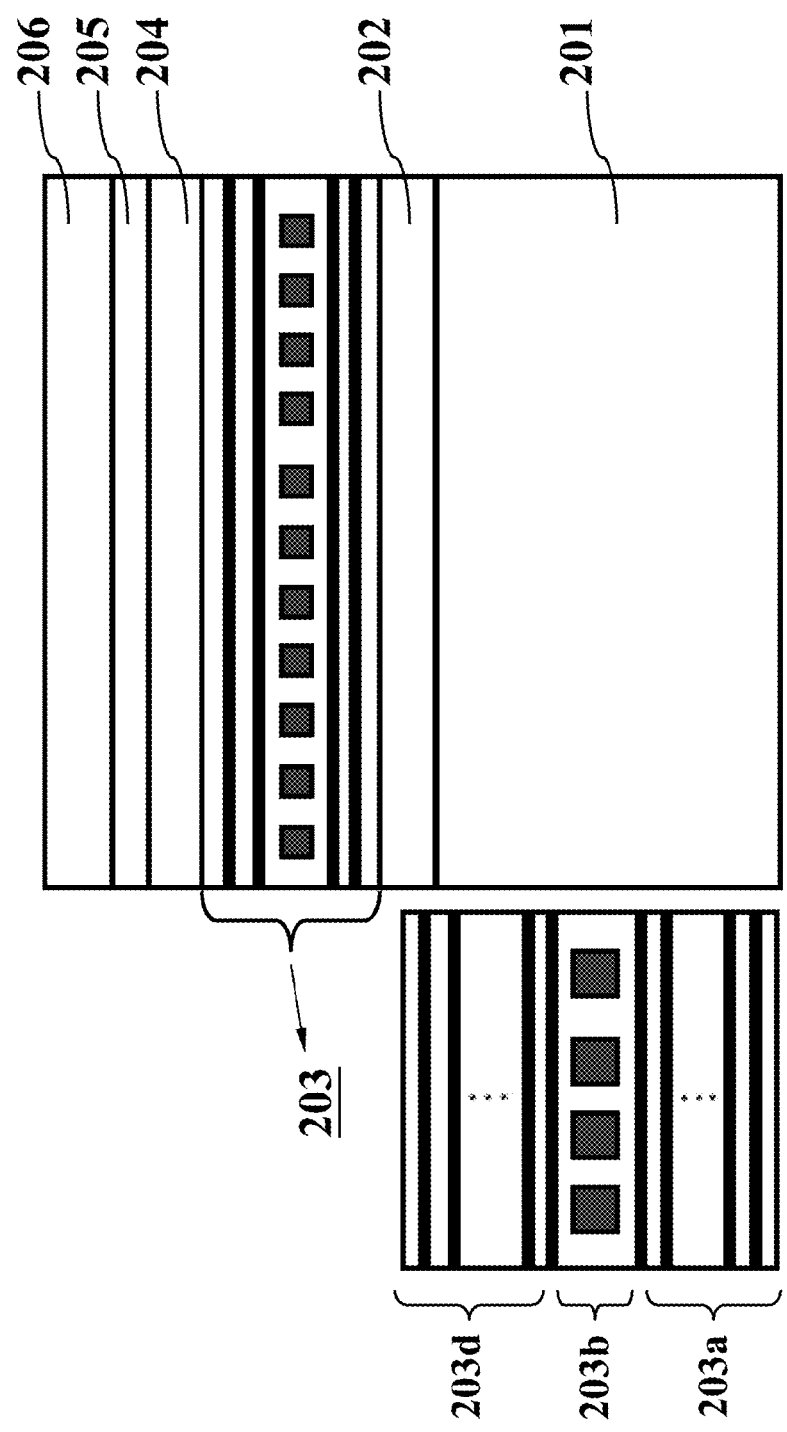
FIG. 3 is a structural diagram of the LED epitaxial structure of the GaN-based vertical LED according to Embodiment 1.

FIG. 3 is a structural diagram of the LED epitaxial structure of the GaN-based vertical LED according to Embodiment 1, comprising a compound multi-current spreading layer. The nitride vertical LED of this embodiment has a structure in which the following layers are laminated successively on the sapphire substrate 201:

First, an extrinsically-doped buffer layer 202 comprises gallium nitride (GaN), aluminum nitride (AlN) or gallium-alumium nitride (GaAlN) with a film thickness of about 200 Å-500 Å.

Next, a compound multi-current spreading layer 203 successively-laminated by a first current spreading layer 203a, a second current spreading layer 203b, a third current spreading layer 203d and the film thickness is 15000 Å-100000 Å. The film thickness of the first current spreading layer 203a is 10000 Å-40000 Å; the film thickness ratio between the u-type nitride semiconductor layer and the n-type nitride semiconductor layer is 1.5:1 and the number of laminated cycles is 40. The second current spreading layer 203b is a distributed insulation layer formed on the n-type nitride semiconductor layer through ion implantation, which comprises insulation parts isolated at preset interval.

The film thickness is 100 Å-5000 Å. The film thickness of the third current spreading layer 203d is 4000 Å-18000 Å; the film thickness ratio between the u-type nitride semiconductor layer and the n-type nitride semiconductor layer is 1:1 and the number of laminated cycles is 18.

In the first current spreading layer 203a and the third current spreading layer 203d, the Si-doping concentration in the u-type nitride semiconductor layer is lower than $5\times10^{17}$ $cm^{-3}$ and the Si-doping concentration in the n-type nitride semiconductor layer is higher than $1\times10^{18}$ $cm^3$.

Next, an active layer 204 of a multi-quantum well structure with InGaN layer as the well layer and a GaN layer as the barrier layer, wherein, the film thickness of the well layer is 18 Å-30 Å and the film thickness of the barrier layer is 80 Å-200 Å.

Next, an electron blocking layer 205 comprises Mg-doped AlInGaN. The film thickness is 100 Å-600 Å.

Next, a P-type GaN layer 206 comprises GaN, InGaN or GaN. The film thickness is 1000 Å-3000 Å.

Figure 4:
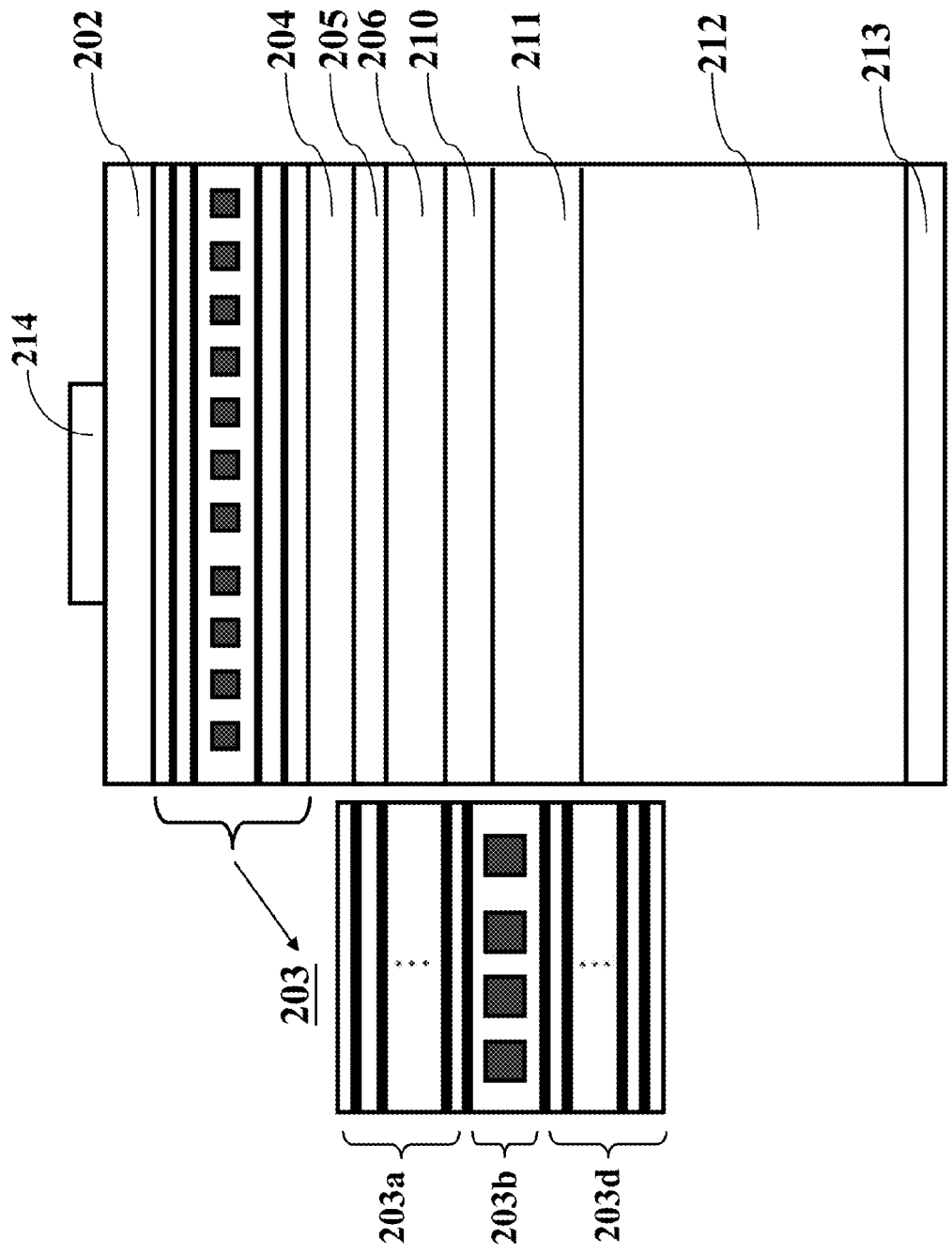
FIG. 4 is a side sectional view of the GaN-based vertical LED component according to Embodiment 1.

The side sectional view of the vertical LED component obtained through chip fabrication process is as shown in FIG. 4, an epitaxial structure comprises an extrinsically-doped buffer layer 202, a compound multi-current spreading layer 203, an active layer 204, an electron blocking layer 205 and a P-type GaN layer 206 is mounted reversely on the conductive substrate 212. In general, thermal dissipation materials like silicon wafer and ceramic wafer are selected for the conductive substrate 212. The substrate 212 as shown in the drawing comprises electrically conductive materials. However, It is not limited to this type of materials. A through-hole substrate can also be used, which has better thermal dissipation effects. A p-surface reflector and ohmic electrode layer 210 is arranged between the P-type GaN layer 206 and the conductive substrate 212 and bonded on the conductive substrate through the bonding layer 211. To prevent metal expansion, a metal expansion blocking layer can be added in the bonding layer. A bottom electrode metal layer 213 is formed on the back of the conductive substrate 212. The N-surface electrode metal layer 214 is directly deposited on the extrinsically-doped buffer layer 202.

The fabrication methods for vertical LED component comprises:

First, forming an extrinsically-doped buffer layer 202 and a first current spreading layer and a second current spreading layer of a compound multi-current spreading layer 203 on a sapphire substrate 201 through MOCVD epitaxial growth, and forming a distributed insulation layer with parts isolated at preset interval on the second current spreading layer through ion implantation.

Next, forming a third current spreading layer 203d, an active layer 204, an electron blocking layer 205 and a P-type GaN layer 206 on the second current spreading layer 203b through second epitaxial growth to complete the epitaxial growth.

Next, performing mesa etching for the epitaxial wafer using dry etching process and the selective pattern etching for the epitaxial wafer to finish the chip-level separation of the LED chip based on preset size and interval. The etching depth should at least pass through the thin film of the epitaxial layer.

Next, fabricating a P-surface reflector and ohmic electrode layer 210, a P-surface metal diffusion blocking layer and bonding layer 211 on the P-surface of the epitaxial layer based on the chip design pattern.

Next, inversing the epitaxial wafer to the conductive substrate 212 through metal bonding process.

Next, removing the sapphire substrate 201 through laser lift-off, grinding, wet etching or any of these two methods. At this time, the sapphire substrate is separated from the film of the epitaxial layer of the LED. The film of the epitaxial layer of the LED remains on the conductive substrate 212 and the sapphire substrate is lifted off automatically, thus forming a structure for fabricating vertical LED device. The extrinsically-doped buffer layer 202 is exposed on the surface.

Next, fabricating an N-surface electrode metal layer 214 with N-type surface textured and surface etched and a bottom electrode metal layer 213 to finish the vertical LED fabrication.

Figure 5:
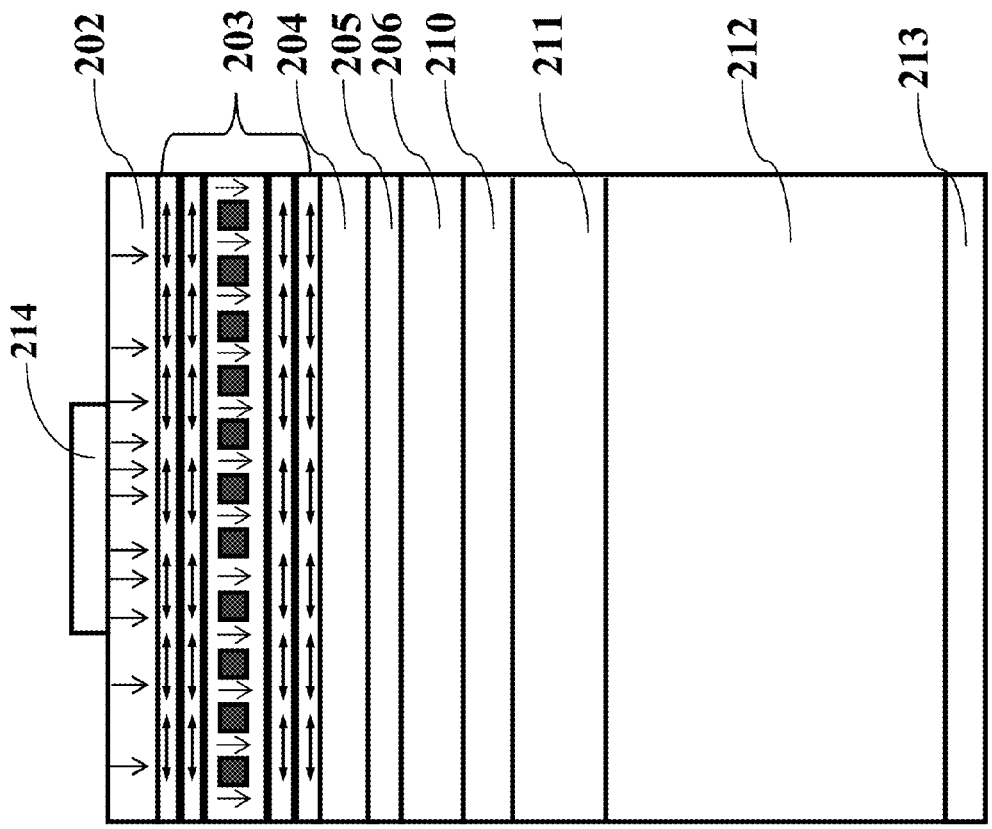
FIG. 5 is a schematic diagram for current spreading of the GaN-based vertical LED component according to Embodiment 1.

Referring to FIG. 5, in this embodiment, the current source imported from the N-surface electrode metal layer 214, through the alternative layer of the u-type layer and the n-type layer on the first current spreading layer 203a, undertakes a first two-dimensional horizontal spreading; through the uniform distribution of impressed current of the distributed insulation layer on the second current spreading layer 203b, a uniformly distributed point current source is formed; different point current sources are forced to undertake second two-dimensional horizontal spreading through alternatively-laminated layer comprises a u-type layer and an n-type layer on the third current spreading layer 203d so as to uniformly spread current over the whole light emitting area, thus outperforming traditional non-current spreading layer and single current spreading designs in terms of current spreading. Further, a matching design is available based on the shape, size, distribution density of the insulation layer of the second current spreading layer and the film thickness ratio between the u-type layer and the n-type layer and the number of laminated cycles of the first current spreading layer and the third current spreading layer. For example, if the distribution density of the insulation layer of the second current spreading layer is high, the number of laminated cycles of the first current spreading layer and the third current spreading layer will be lesser; on the contrary, if the distributed density of the insulation layer of the second current spreading layer is low, the number of laminated cycles of the first current spreading layer and the third current spreading layer will be greater to uniformly spread the current over the whole light emitting area so as to effectively improve the light emitting efficiency of the nitride LED component and the static breakdown voltage. FIG. 5 and FIG. 2 are schematic diagrams for current spreading of the GaN-based vertical LED components with or without the embodiments of the present disclosure respectively.

Embodiment 2

Figure 6:
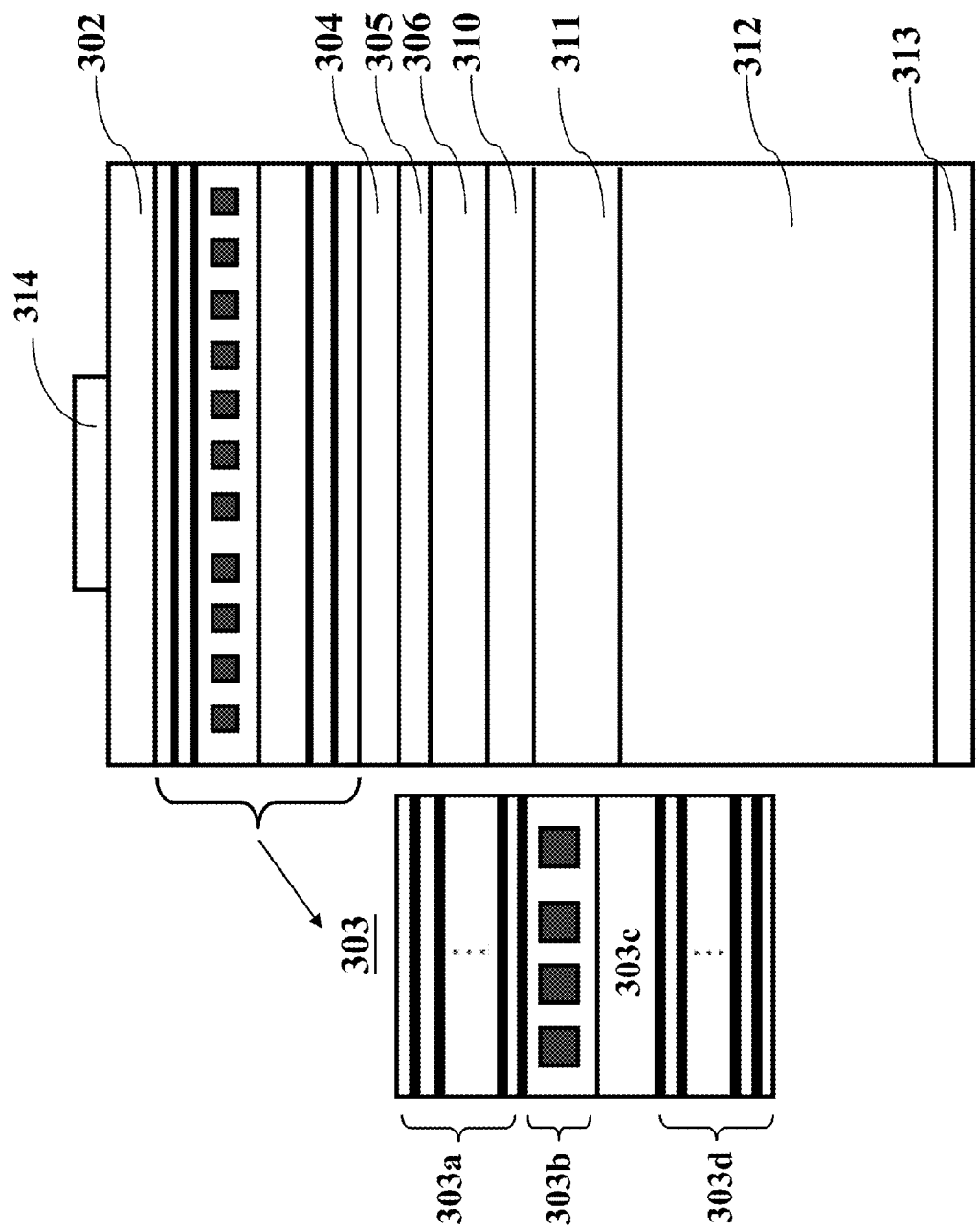
FIG. 6 is a side sectional view of the GaN-based vertical LED component according to Embodiment 2.
Figure 7:
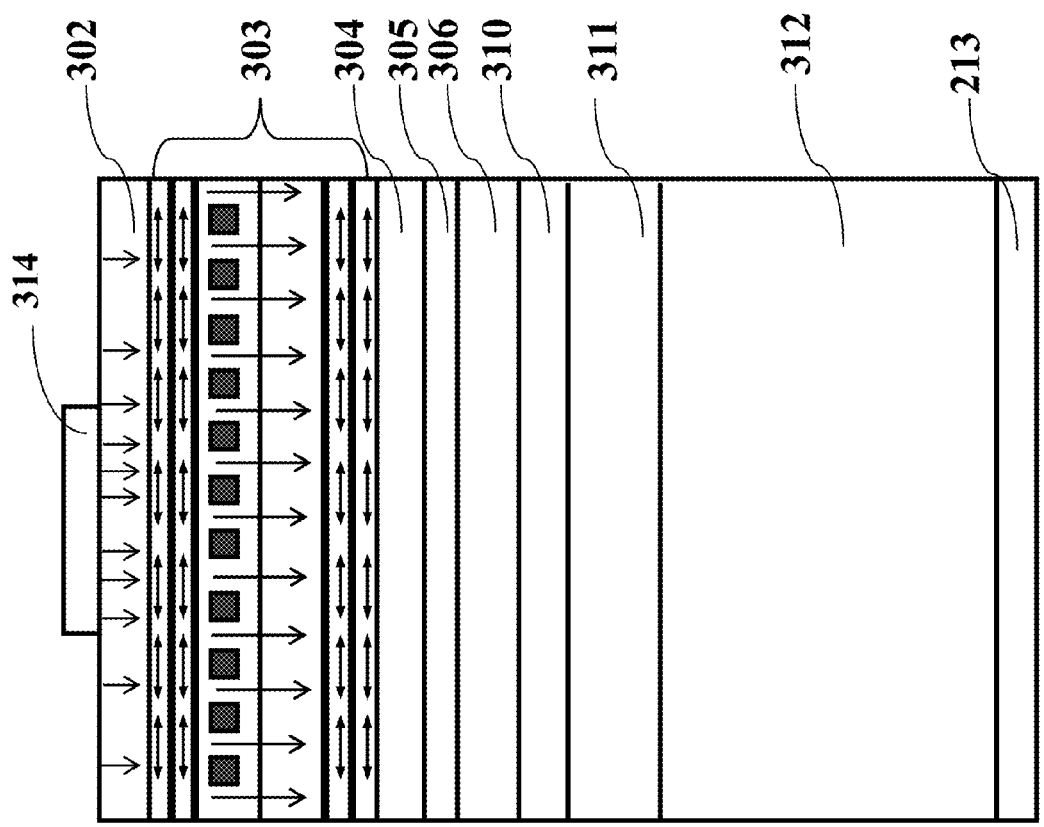
FIG. 7 is a schematic diagram for current spreading of the GaN-based vertical LED component according to Embodiment 2.

FIG. 6 is a side sectional view of the GaN-based vertical LED component according to Embodiment 2.

Compared with Embodiment 1, in the compound multi-current spreading layer of this embodiment, a Si-doped n-type gradient layer 303c is added between the second current spreading layer and the third current spreading layer. The Si-doped n-type gradient layer 303c is designed as an n-type nitride semiconductor layer with Si-doping concentration changed from low ($5\times10^{17}$ $cm^{-3}$) to high ($1\times10^{19}$ $cm^{-3}$) formed through second epitaxial growth to repair and improve the surface defect of the second current spreading layer due to ion implantation through the Si-doped n-type nitride gradient semiconductor layer, so as to maintain the lattice quality of the nitride semiconductor layer after second epitaxy and to serve as the current steering layer of the third current spreading layer.

In this embodiment, to better illustrate the benefits of the present invention (with the compound multi-current spreading layer disclosed in the present invention) in comparison to traditional GaN-based vertical LED (without the compound multi-current spreading layer disclosed in the present invention), 2 samples are fabricated according to the process (with the compound multi-current spreading layer disclosed in the present invention) in this invention and according to the traditional process (without the compound multi-current spreading layer disclosed in the present invention) to assess the light emitting output power and static breakdown voltage characteristics respectively.

In this embodiment, set the film thicknesses for semiconductor layers as shown in Table 1.

TABLE 1

| Layer | Film thickness (Å) and structure of different layers in the present disclosure | Film thickness (Å) and structure of different layers in traditional process |
|---|---|---|
| Extrinsically-doped buffer layer | 300 | 300 |
| Alternatively-laminated layer of compound multi-current spreading layer | 303a film thickness: 20000; 303b film thickness: 1500; 103c film thickness: 3500; 303d film thickness: 10000; (303 total film thickness 35000) | None (N-type GaN layer 35000) |
| Active layer | GaN(140)/InGaN(25) X10 cycle (last layer: GaN layer) | GaN(140)/InGaN(25) X10 cycle (last layer: GaN layer) |
| Electron blocking layer | 600 | 600 |
| P-type GaN layer | 2000 | 2000 |

Figure 8:
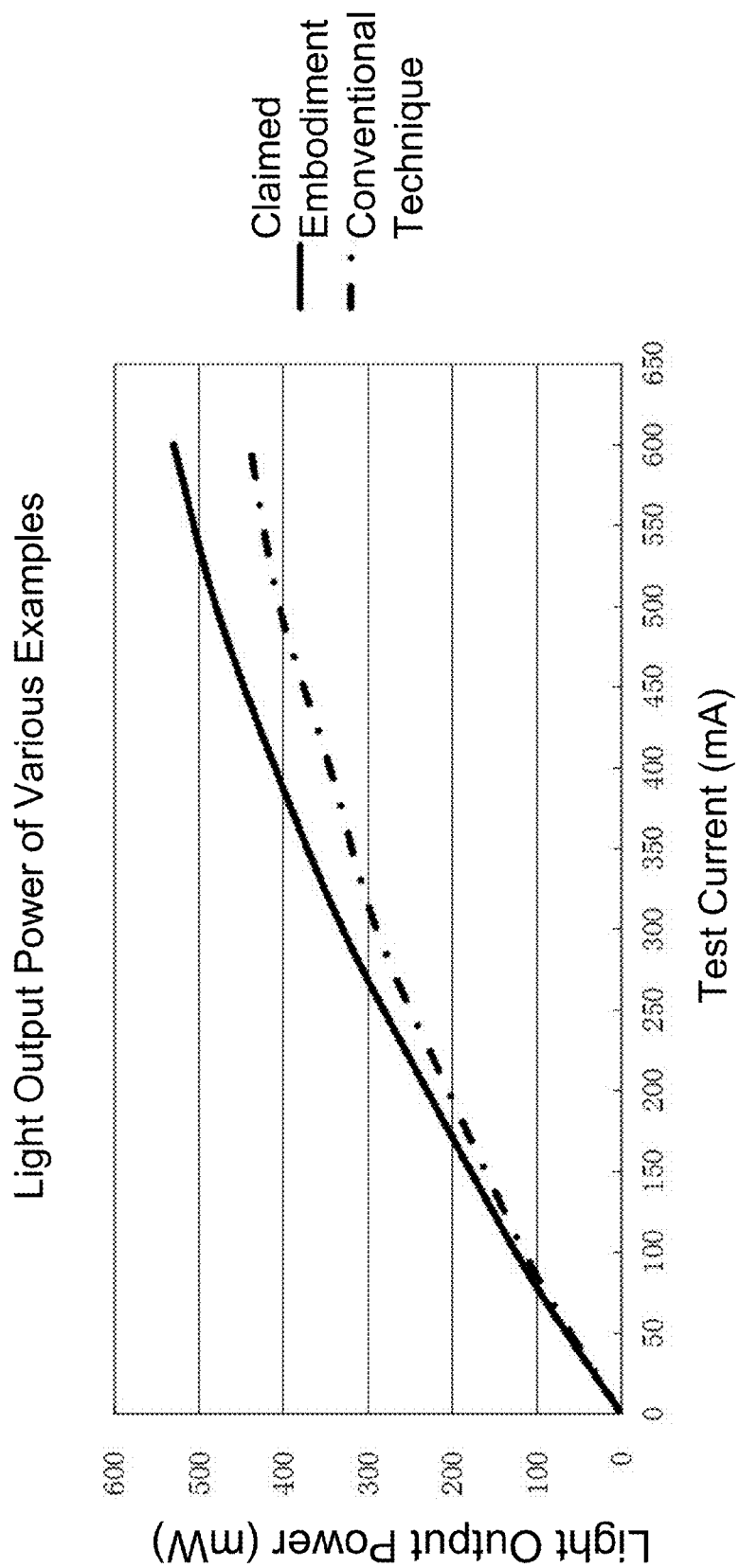
FIG. 8 is a graph of light-emitting output powers according to Embodiment 2.
Figure 9:
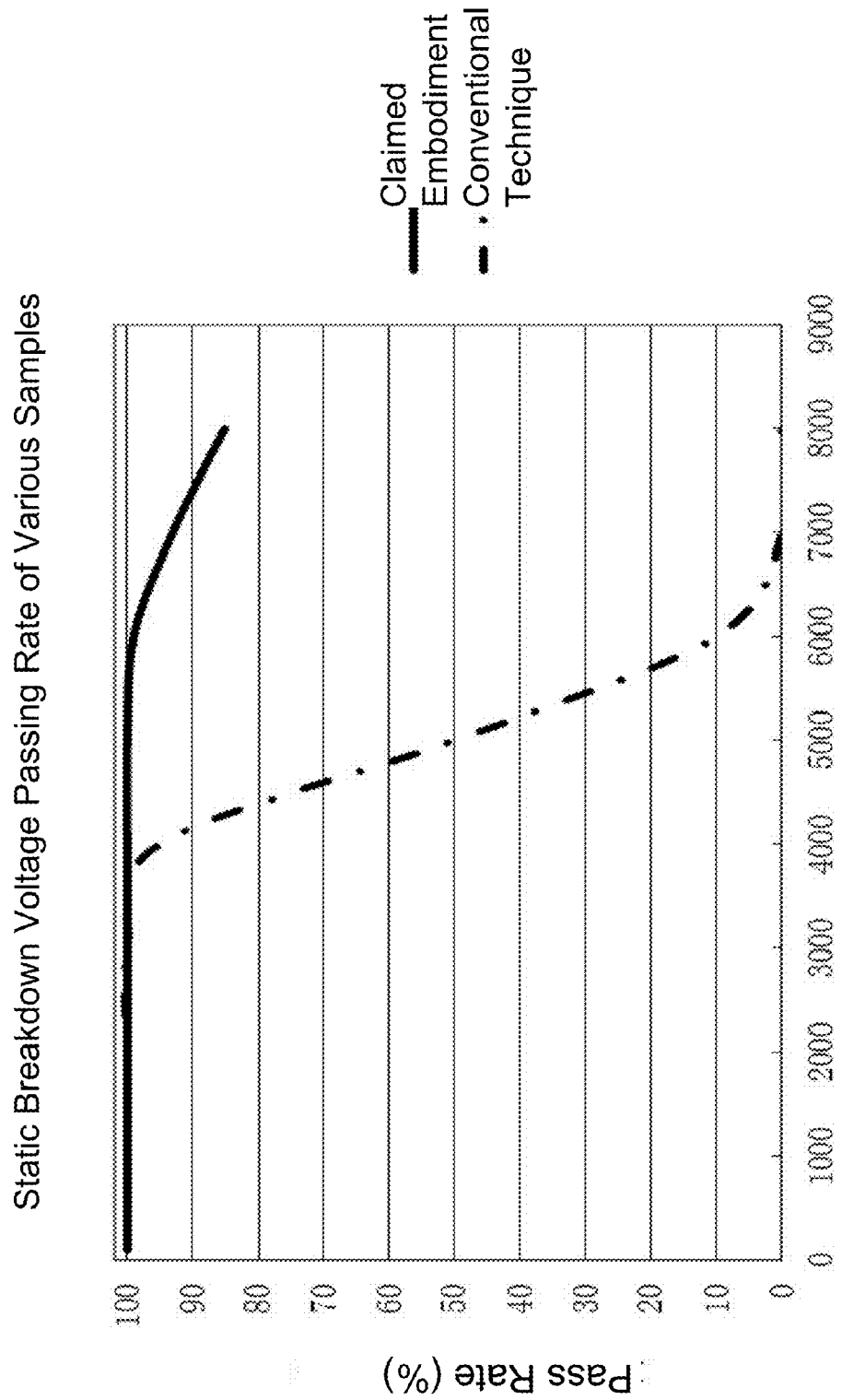
FIG. 9 is a chart for static breakdown voltage passing rate according to Embodiment 2.

FIGS. 8-9 show the assessment results.

Referring to the graph of light-emitting output powers for various samples in the embodiments of the present disclosure (FIG. 8), the GaN-based vertical LED component sample outperforms the traditional GaN-based vertical LED component sample by about 10%-20% in terms of light-emitting output power.

Referring to the chart for static breakdown voltage passing rates for various samples in the embodiments of the present disclosure (FIG. 9), the GaN-based vertical LED component sample outperforms the traditional GaN-based vertical LED component sample in terms of static breakdown voltage.

The invention claimed is:

1. A light emitting diode (LED) comprising:
   an n side layer and a p side layer formed with nitride semiconductors, respectively;
   an active layer comprising a nitride semiconductor between the n side layer and the p side layer;
   wherein:
      the n side layer is successively laminated by an extrinsically-doped buffer layer and a compound multi-current spreading layer; the compound multi-current spreading layer is successively-laminated by a first current spreading layer, a second current spreading layer and a third current spreading layer;
      the first current spreading layer and the third current spreading layer each are alternatively-laminated layers comprising a u-type nitride semiconductor layer and an n-type nitride semiconductor layer; the second current spreading layer is a distributed insulation layer formed on the n-type nitride semiconductor layer; and
      the first current spreading layer is on the extrinsically-doped buffer layer, and the third current spreading layer is adjacent to the active layer;
   wherein the third current spreading layer is configured for a two-dimensional spreading of current from distributed point current sources formed by the second current spreading layer; and
   wherein the extrinsically-doped buffer layer is configured for directly coupling to an electrode metal layer.

2. The LED of claim 1, wherein the compound multi-current spreading layer further comprises a Si-doped n-type nitride gradient semiconductor layer between the second current spreading layer and the third current spreading layer.

3. The LED of claim 2, further comprising a conductive substrate, and a vertical light-emitting epitaxial structure including the p side layer, the active layer and the n side layer disposed over the conductive substrate.

4. The LED of claim 2, wherein the distributed insulation layer comprises insulation portions separated with preset intervals.

5. The LED of claim 2, wherein a film thickness of the compound multi-current spreading layer is about 1000 Å-100000 Å.

6. The LED of claim 2, wherein a film thickness of the second current spreading layer is about 100 Å-5000 Å.

7. The LED of claim 2, wherein a film thickness of the Si-doped n-type nitride gradient semiconductor layer is about 200 Å-5000 Å.

8. The LED of claim 2, wherein the Si-doped n-type nitride gradient semiconductor layer is formed through second epitaxial growth and the Si-doping concentration gradually varies from $1\times10^{17}$ cm$^{-3}$ to $5\times10^{19}$ cm$^{-3}$.

9. The LED of claim 8, wherein, the Si-doped n-type nitride gradient semiconductor layer is formed through secondary epitaxial growth and the Si-doping concentration gradually varies from $5\times10^{17}$ cm$^{-3}$ to $1\times10^{19}$ cm$^{-3}$.

10. The LED of claim 2, wherein a film thickness of the first current spreading layer and the third current spreading layer is about 350 Å-45000 Å; a film thickness ratio between the u-type nitride semiconductor layer and the n-type nitride semiconductor layer is more than 0.8 and the number of laminated cycles is 1-100.

11. The LED of claim 10, wherein a film thickness of the first current spreading layer is about 10000 Å-40000 Å; a film thickness ratio between the u-type nitride semiconductor layer and the n-type nitride semiconductor layer is 1.5:1 and the number of laminated cycles is 40.

12. The LED of claim 11, wherein a film thickness of the third current spreading layer is about 4000 Å-18000 Å; a film thickness ratio between the u-type nitride semiconductor layer and the n-type nitride semiconductor layer is 1:1 and a number of laminated cycles is 18.

13. The LED of claim 1, wherein in the first current spreading layer and the third current spreading layer, the Si-doping concentration in the u-type nitride semiconductor layer is less than $5\times10^{17}$ cm$^{-3}$ and the Si-doping concentration in the n-type nitride semiconductor layer is more than $1\times10^{18}$ cm$^{-3}$.

14. A system comprising one or more light emitting diodes (LEDs), wherein each LED comprises:

an n-side layer and a p-side layer formed with nitride semiconductors, respectively;
an active layer comprising a nitride semiconductor between the n-side layer and the p-side layer;
wherein:
the n-side layer is successively laminated by an extrinsically-doped buffer layer and a compound multi-current spreading layer; the compound multi-current spreading layer is successively-laminated by a first current spreading layer, a second current spreading layer and a third current spreading layer;
the first current spreading layer and the third current spreading layer each are alternatively-laminated layers comprising a u-type nitride semiconductor layer and an n-type nitride semiconductor layer; the second current spreading layer is a distributed insulation layer formed on the n-type nitride semiconductor layer; and
the first current spreading layer is on the extrinsically-doped buffer layer, and the third current spreading layer is adjacent to the active layer;
wherein the third current spreading layer is configured for a two-dimensional spreading of current from distributed point current sources formed by the second current spreading layer; and
wherein the extrinsically-doped buffer layer is configured for directly coupling to an electrode metal layer.

15. The system of claim 14, wherein the compound multi-current spreading layer further comprises a Si-doped n-type nitride gradient semiconductor layer between the second current spreading layer and the third current spreading layer.

16. A fabrication method for a light emitting diode (LED), comprising:
providing a growth substrate and forming an n-side layer with a nitride semiconductor over the substrate;
forming an active layer with a nitride semiconductor over the n-side layer;
forming a p-side layer with a nitride semiconductor over the active layer to form an epitaxial structure;
wherein:
the n-side layer is successively laminated by an extrinsically-doped buffer layer and a compound multi-current spreading layer; the compound multi-current spreading layer is successively-laminated by a first current spreading layer, a second current spreading layer and a third current spreading layer;
the first current spreading layer and the third current spreading layer are alternatively-laminated layers comprising a u-type nitride semiconductor layer and an n-type nitride semiconductor layer; the second current spreading layer is a distributed insulation layer formed on the n-type nitride semiconductor layer; and
the first current spreading layer is on the extrinsically-doped buffer layer, and the third current spreading layer is adjacent to the active layer;
wherein the resulting LED comprises:
the n side layer and the p side layer formed with nitride semiconductors, respectively;
the active layer comprising a nitride semiconductor between the n side layer and the p side layer;
wherein:
the n side layer is successively laminated by an extrinsically-doped buffer layer and a compound multi-current spreading layer; the compound multi-current spreading layer is successively-laminated by the first current spreading layer, the second current spreading layer and the third current spreading layer;
the first current spreading layer and the third current spreading layer each are alternatively-laminated layers comprising a u-type nitride semiconductor layer and an n-type nitride semiconductor layer; the second current spreading layer is a distributed insulation layer formed on the n-type nitride semiconductor layer; and
the first current spreading layer is adjacent to the extrinsically-doped buffer layer, and the third current spreading layer is adjacent to the active layer;
wherein the third current spreading layer is configured for a two-dimensional spreading of current from distributed point current sources formed by the second current spreading layer; and
wherein the extrinsically-doped buffer layer is configured for directly coupling to an electrode metal layer.

17. The method of claim 16, wherein said forming the n-side layer comprises:
forming an extrinsically-doped buffer layer, a first current spreading layer and a second current spreading layer on the growth substrate through epitaxial growth in successive, and forming a distributed insulation layer with parts isolated at preset interval on the second current spreading layer through ion implantation; and
forming a third current spreading layer on the second current spreading layer through second epitaxial growth.

18. The method of claim 17, further comprising:
forming a Si-doped n-type nitride gradient semiconductor layer between the second current spreading layer and the third current spreading layer.

19. The method of claim 18, further comprising:
providing a conductive substrate;
bonding the epitaxial structure with the conductive substrate;
removing the growth substrate; and
fabricating a p electrode and an n electrode to form a vertical LED.

20. The method of claim 19, wherein:
in the first current spreading layer and the third current spreading layer, the Si-doping concentration in the u-type nitride semiconductor layer is less than $5 \times 10^{17}$ cm$^{-3}$ and the Si-doping concentration in the n-type nitride semiconductor layer is more than $1 \times 10^{18}$ cm$^{-3}$;
the film thickness of the compound multi-current spreading layer is 1000 Å-100000 Å;
the film thickness of the third current spreading layer is 4000 Å-18000 Å;
the film thickness ratio between the u-type nitride semiconductor layer and the n-type nitride semiconductor layer is 1:1 and the number of laminated cycles is 18;
the film thickness of the first current spreading layer and the third current spreading layer is 350 Å-45000 Årespectively;
the film thickness ratio between the u-type nitride semiconductor layer and the n-type nitride semiconductor layer is more than 0.8 and the number of laminated cycles is 1-100; and
the film thickness of the first current spreading layer is 10000 Å-40000 Å; the film thickness ratio between the u-type nitride semiconductor layer and the n-type nitride semiconductor layer is 1.5:1 and the number of laminated cycles is 40.

* * * * *